(12) United States Patent
Satou

(10) Patent No.: US 7,206,187 B2
(45) Date of Patent: Apr. 17, 2007

(54) CERAMIC ELECTRONIC COMPONENT AND ITS MANUFACTURING METHOD

(75) Inventor: Hisashi Satou, Kokubu (JP)

(73) Assignee: Kyocera Corporation, Kyoto-shi, Kyoto (JP)

( * ) Notice: Subject to any disclaimer, the term of this patent is extended or adjusted under 35 U.S.C. 154(b) by 0 days.

(21) Appl. No.: 11/210,080

(22) Filed: Aug. 23, 2005

(65) Prior Publication Data

US 2006/0039097 A1    Feb. 23, 2006

(30) Foreign Application Priority Data

Aug. 23, 2004  (JP)  ............................. 2004-242974
Aug. 23, 2004  (JP)  ............................. 2004-242976
Sep. 29, 2004  (JP)  ............................. 2004-283562

(51) Int. Cl.
  *H01G 4/228*  (2006.01)
  *H01G 4/005*  (2006.01)

(52) U.S. Cl. ................. 361/309; 361/303; 361/311

(58) Field of Classification Search ............. 361/301.4, 361/303, 305, 306.1, 306.3, 308.1, 309, 311
See application file for complete search history.

(56) References Cited

U.S. PATENT DOCUMENTS

| 6,151,204 | A  | * | 11/2000 | Shigemoto et al. | ......... 361/305 |
| 6,195,249 | B1 | * | 2/2001  | Honda et al.     | ............ 361/306.3 |
| 6,349,026 | B1 | * | 2/2002  | Nakamura         | .................. 361/303 |
| 2004/0218344 | A1 | * | 11/2004 | Ritter et al.    | ............. 361/306.3 |

FOREIGN PATENT DOCUMENTS

| JP | 05/003131  | 1/1993 |
| JP | 2002/270457 | 9/2002 |

* cited by examiner

*Primary Examiner*—Eric W. Thomas
(74) *Attorney, Agent, or Firm*—Volpe and Koenig, P.C.

(57) ABSTRACT

Ceramic electronic components having improved peel resistance and a method of manufacturing them are disclosed. The components have laminated bodies that include internal electrodes which join or bond the layer to the external conductor and prevent the external conductor from peeling.

15 Claims, 5 Drawing Sheets

CERAMIC ELECTRONIC COMPONENT AND ITS MANUFACTURING METHOD

FIELD OF THE INVENTION

The present invention relates to a ceramic electronic components and their manufacturing method.

BACKGROUND OF THE INVENTION

FIG. 1 is a sectional view showing a conventional ceramic capacitor.

In the ceramic capacitor 30 shown in FIG. 1, a laminated body 31 is formed by laminating a plurality of ceramic dielectric layers 32 with internal electrodes 33 and 34 are interposed between adjacent dielectric layers 32 in the laminated body 31. External electrodes 35 and 36 are electrically connected to the respective ends of the internal electrodes 33 and 34 and extend to four side faces of the laminated body 31.

In the ceramic capacitor 30, the external electrodes 35 and 36 contain a metal component and a glass component. At the time of firing, the metal component of the external electrodes 35 and 36 join the end faces so that the external electrodes 35 and 36 are electrically connected to the laminated body 31. Japanese Unexamined Patent Publication No. 2002-270457 discloses such a connection (refer to Japanese Unexamined Patent Publication No. 05-3131, for example).

A manufacturing method of the ceramic capacitor 30 comprises a step of laminating a ceramic green sheet 32 as a dielectric layer and the internal electrodes 33 and 34 alternately to form the unfired laminated body 31, a step of forming the external electrode conductor films 35 and 36 used as external electrodes on a pair of end faces of the unfired laminated body 31, and a step of firing the unfired laminated body 31 on the external electrode conductor film 35 and 36 are formed to obtain the ceramic capacitor 30

In the prior art ceramic capacitor 30, as shown in FIG. 1, there is a problem that peeling (represented by 37 in FIG. 1) of the external electrodes 35 and 36 is likely to occur due to external forces.

An object of the present invention is to provide a ceramic electronic component that can effectively resist peeling of external electrodes.

Another object of the present invention is to provide a method of manufacturing a ceramic electronic component that can effectively resist peeling of external electrodes.

SUMMARY OF THE INVENTION

An electronic component containing internal and external conductive patterns within a laminated body having a plurality of layers. At least one internal electrode is provided to improve peel resistance. The internal electrode is separated from the external electrode by at least one layer of laminate and is bonded to the external electrode through a metal particle located in the separating layer of laminate.

DETAILED DESCRIPTION OF PREFERRED EMBODIMENTS

Figure 1:
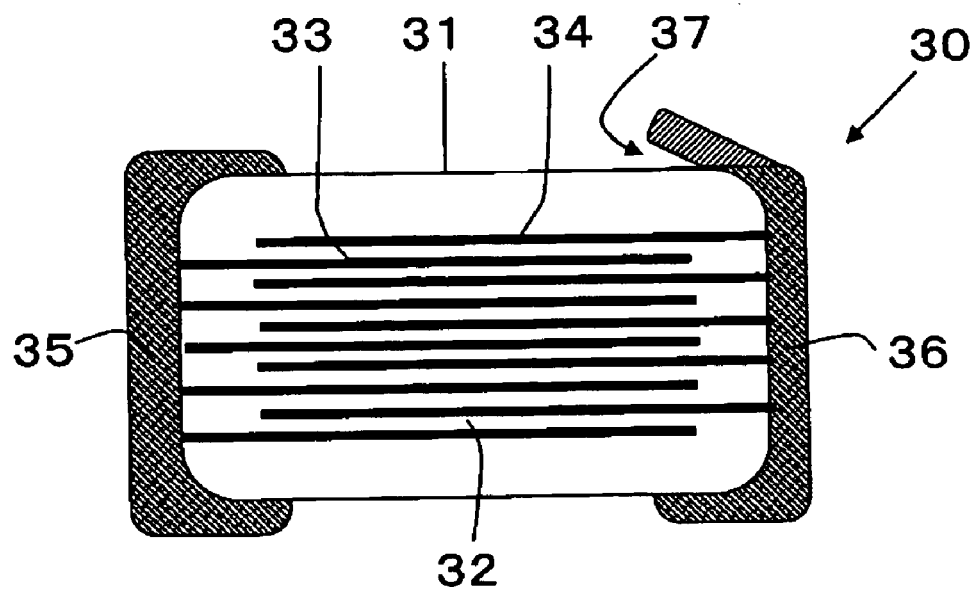
FIG. 1 is a sectional view showing a prior art component.
Figure 2:
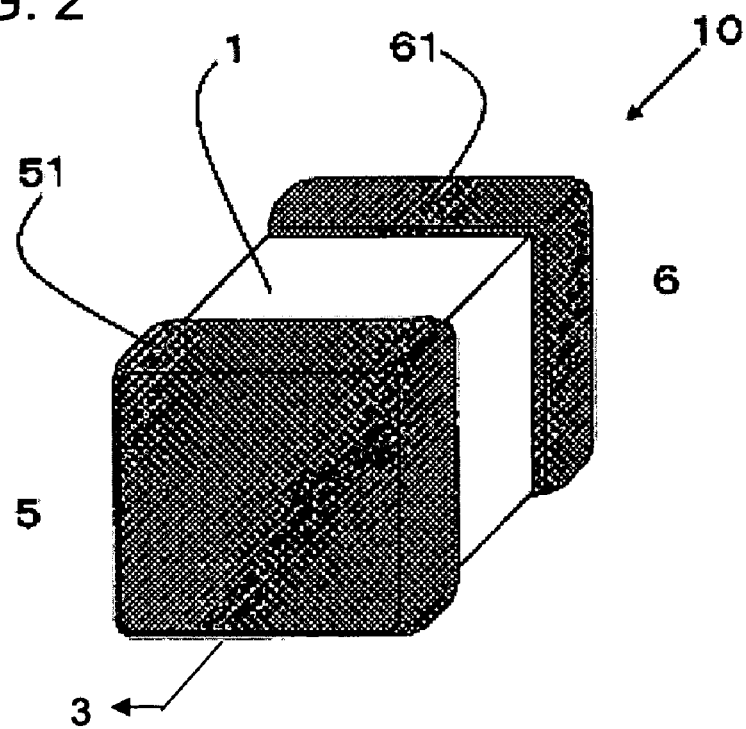
FIG. 2 is illustrative perspective view of ceramic capacitor in accordance with an embodiment of the present invention.
Figure 3:
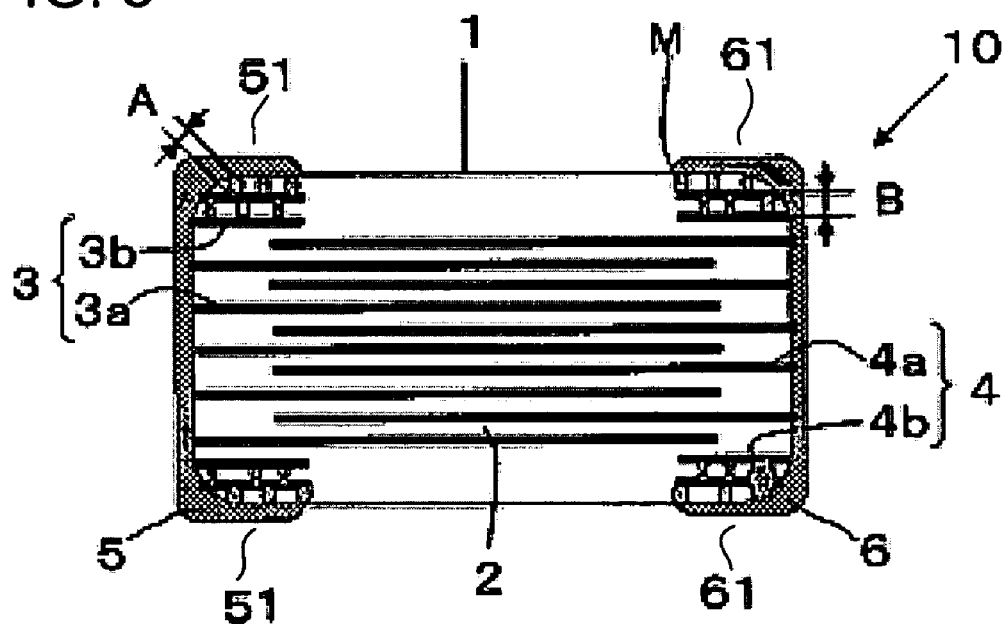
FIG. 3 is a sectional view of the ceramic capacitor along the line 3—3.

FIG. 2 is a perspective view showing a ceramic capacitor in accordance with an embodiment of the present invention, and FIG. 3 is a sectional view of that capacitor. In the ceramic capacitor 10, a laminated body 1 is formed by laminating a plurality of ceramic dielectric layers 2 and internal electrodes 3 and 4 are interposed between adjacent dielectric layers 2 in the laminated body 1.

The internal electrode 3a terminates at one end face of the laminated body 1 and is connected to external electrode 5. The internal electrode 4a terminates at the other end face body 1, and is connected to external electrode 6. External electrodes 5 and 6 are formed on respective end faces of the laminated body 1. The internal electrodes 3a, 4a are referred to as "first internal electrodes 3a, 4a".

As shown in FIG. 2, the external electrodes 5 and 6 cover a respective end face of the laminated body 1 and each extends part way around four side faces. The portions perpendicular to the direction of laminating the dielectric layers 2 are referred to as "principal faces", and the portions wrapped around the sides are referred to as "extended portions 51 and 61".

The dielectric layer 2 is formed of a dielectric material containing $BaTiO_3$, $CaTiO_3$, $SrTiO_3$ or the like as a main component so as to have a thickness of 0.5 to 4 μm. The laminated body 1 may be formed by laminating from 20 to 2000 layers of the dielectric layer 2.

The first internal electrodes 3a and 4a are formed of a conductive material containing a metal such as Ni, Cu, Cu—Ni and Ag—Pd as a main component so as to have a thickness of 0.5 to 2.0 μm.

The external electrodes 5 and 6 are formed of a conductive material containing a metal such as Ni, Cu, Ag, Au and Sn as a main component. The external electrodes 5 and 6 may be formed by (a) applying a conductive paste and then sintering it or (b) depositing a metal plating film by the electroless plating method.

The external electrodes 5 and 6 shown in FIG. 2 were formed by applying a conductive paste and then sintering it and a glass component is added to a conductive material containing a metal such as Ni, Cu, Cu—Ni and Ag as a main component.

Advantageously, the ceramic capacitor manufactured by the deposition method above improves the accuracy of thickness and forming position of the external electrodes 5 and 6 and the external electrodes 5 and 6 can be formed in a desirable pattern by the simple treatment of soaking the laminated body 1 in a plating liquid for electroless plating for a predetermined time period to increase productivity of the ceramic capacitor 10. The ceramic capacitor was treated with Pd activator solution and then plated in electroless Cu solution for 60 to 120 min.

According to the present invention one or more of the internal electrodes 3b and 4b embedded in the laminated body 1 are dummy or supplemental electrodes (referred to as "second internal electrodes"). In FIG. 3, two layers of the second internal electrodes 3b and 4b are arranged in the vicinity of the upper and lower principal faces of the laminated body 1. The second internal electrodes 3b and 4b are not directly connected to the first internal electrodes 3a and 4a.

The second internal electrodes 3b and 4b may be formed of the same conductive material as first internal electrodes 3a and 4a or the different conductive material from the first internal electrodes 3a and 4a. Any number equal to or more than one of layers is acceptable.

The first internal electrode 3a and the second internal electrode 3b are collectively referred to as a "internal electrode 3" and the first internal electrode 4a and the second internal electrode 4b are collectively referred to as a "internal electrode 4".

In FIG. 3, the top layers of the second internal electrodes 3b and 4b face a respective extended portions 51 and 61 across one dielectric layer 2.

The second internal electrodes 3b and 4b are connected to the extended portions 51 and 61 of the external electrodes 5 and 6, respectively, through one or more metal particles "M" which exist in the dielectric layer 2 and are preferably oriented in the laminating direction (direction perpendicular to the plane of dielectric layers 2). The metal particles "M" are connected to small metal particles existing in the second internal electrodes 3b and 4b (hereinafter referred to as fine metal particles "m") and fine metal particles "m" existing in the external electrodes 5 and 6.

The metal particle "M" and the metal particle "m" are preferably composed of Ni, Cu, Cu—Ni, Ag—Pd etc., as in the second internal electrodes 3b, 4b. The metal particle "M" may be the same kind of metal as the fine metal particle "m" or a different kind of metal from the fine metal particle "m".

In the embodiment shown in FIG. 3, the average particle diameter A of the metal particles "M" is set to be 100 to 200% of a thickness B of the dielectric layer 2 located between the second internal electrodes 3b and 4b and the extended portions 51 and 61 of the external electrodes 5 and 6. The effect of setting the average particle diameter A within the predetermined range will be described later. The average particle diameter A of the metal particles "M" and fine metal particles "m" can be measured by performing chemical etching of a fractured surface of the fired laminated body 1 and observing it with a metallurgical microscope. Then, diameters of 20 to 30 samples of the metal particles "M" and fine metal particles "m" are measured, and averaged to obtain mean diameters of the metal particles "M" and fine metal particles "m" respectively.

With the above-mentioned configuration utilizing dummy or supplemental electrodes (second internal electrodes), the mechanical connection strength between the external electrodes 5 and 6 and the principal faces of the laminated body 1 can be increased, thereby effectively preventing peeling of the external electrodes 5 and 6 from the laminated body 1. Stated another way this configuration achieves the effect of preventing peeling of the second internal electrodes 3b and 4b from dielectric layer 2.

Since the mechanical connection through the metal particles "M" is made by sintering of the metal particles "M" with the fine metal particles "m" in the second internal electrodes 3b and 4b and sintering of the metal particles "M" with the fine metal particles "m" in the external electrode 5 and 6, the metal particles take a random form and the second internal electrodes 3b and 4b are embedded in the dielectric layer 2 Particles "M" are bonded to the second internal electrodes 3b and 4b, the metal particles "M" themselves are fixed within the laminated body 1 and they are integrated with the external electrodes 5 and 6.

Figure 4:
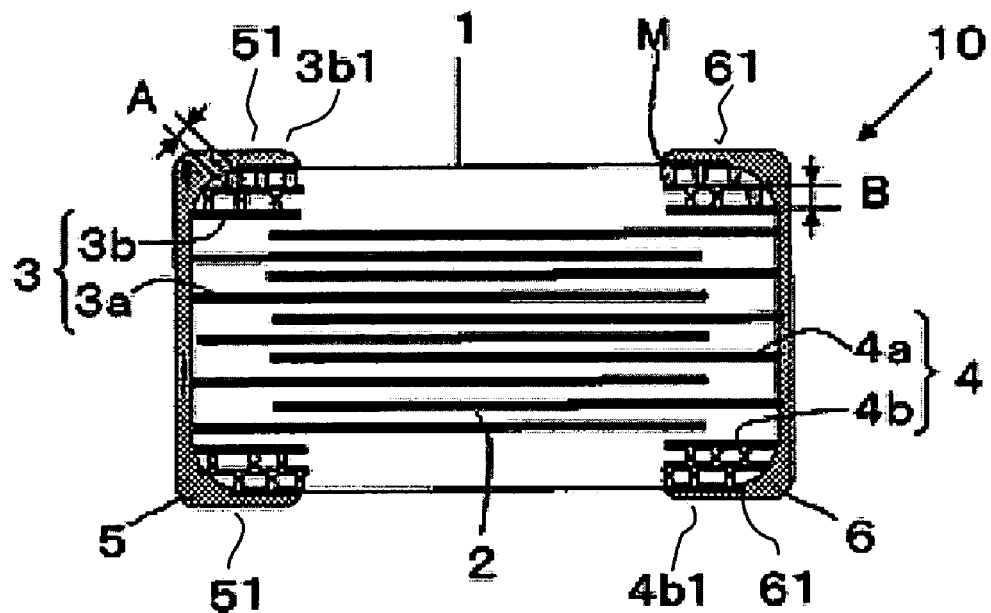
FIG. 4 is a sectional view similar to FIG. 3, showing a ceramic capacitor in accordance with another embodiment of the present invention.

FIG. 4 is a sectional view showing a ceramic capacitor in accordance with another configuration of the present invention.

The configuration of FIG. 4 is different from that of FIG. 3 in that surface electrodes 3b1 and 4b1 are formed on the principal faces of the laminated body 1 of the ceramic capacitor. The external electrodes 5 and 6 are connected, through a plurality of metal particles "M" which exist in the dielectric layer 2, to the surface electrodes 3b1 and 4b1 formed on the principal faces of the laminated body 1 and exposed portions of the first internal electrodes 3a and 4a on the end faces of the laminated body 1. Surface electrodes 3b1 and 4b1 are kinds of dummy or supplemental electrodes.

The metal particles "M" may be contained in one or both of the surface electrodes 3b1 and 4b1 formed on the principal faces of the laminated body 1 or the second internal electrodes 3b and 4b located across one dielectric layer 2.

Hereinafter, a method of manufacturing a ceramic capacitor according to the present invention will be described with reference to FIGS. 5–9. Whether before or after firing, similar members are designated by the same reference numerals.

First, suitable organic solvent, glass frit, organic binder, etc. are added or mixed to a powder formed of a dielectric material containing $BaTiO_3$, $CaTiO_3$, $SrTiO_3$ or the like as a main component to prepare a ceramic slurry. The ceramic slurry thus obtained is formed so as to become a dielectric layer having a predetermined shape and thickness by the conventionally-known doctor blade method. This dielectric layer is commonly called a ceramic green sheet 2.

Subsequently, the conductive paste obtained by adding or mixing suitable organic solvent, glass frit, organic binder, etc. to the powder formed of a metal such as Ni, Cu, Cu—Ni or Ag—Pd is applied in a predetermined pattern, such as by the conventionally-known screen printing or a like method. In this manner, the internal electrodes 3 and 4, as shown in FIGS. 3 and 4, are established.

Figure 5:
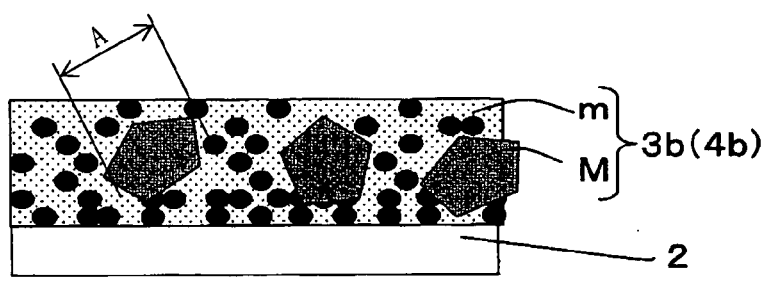
FIGS. 5 to 9 are sectional views that illustrate a method of manufacturing the ceramic capacitor according to the present invention.

With reference to FIG. 5, the metal particles "M" with a relatively large particle diameter are mixed in the conductive pastes used as the second internal electrodes 3b and 4b. It is preferable that the metal particles "M" be 5 to 30% by weight of with respect to the total weight of the metal component in the conductive paste. It has been found that mixing less than 5% of metal particles "M" results in too few connections between the external electrodes 5 and 6 and the principal face of the laminated body to sufficiently maintain the desired strength. In a case where the ratio of the metal particles "M" is more than 30%, it was found that the large number of the metal particles "M" had a tendency to deform the laminated body.

It is desirable that the average particle diameter A of the metal particles "M" is set to be about 100 to 200% of the thickness B of the ceramic green sheets 2 located between the second internal electrodes 3b and 4b and the extended portions 51 and 61 of the external electrodes 5 and 6.

When the average particle diameter A of the metal particles is set to be about 100% or more of the thickness B of the ceramic green sheet 2, the metal particles penetrate the ceramic green sheet 2, thereby certainly connecting the second internal electrodes 3b and 4b to the external electrodes 5 and 6, respectively.

On the other hand, when the average particle diameter A of the metal particles is set to be 200% or less of the thickness B of the ceramic green sheet 2, at the time of manufacturing, the second internal electrodes 3b and 4b can be formed accurately by screen printing or the like, and when the ceramic green sheet 2, first internal electrodes 3a and 4a and second internal electrodes 3b and 4b forming a large-sized laminated body 11 are pressurized, adhesiveness between the ceramic green sheets 2 is preserved.

It is desirable that the average diameter of the metal particles "m" is, for example, 10 to 50% of the thickness B of the ceramic green sheet 2. Thereby, metal particles "m" are sintered to each other to be a continuous metal layer.

When the thickness of the ceramic green sheet 2 is 0.5 to 1 μm, the average particle diameter of the metal particles "M" having a large particle diameter is set to be 0.5 to 2 μm. It is desirable that the average particle diameter of the other fine metal particles "m" falls in the range of 0.1 to 0.3 μm.

When the thickness of the ceramic green sheet 2 is 1 to 2 μm, it is desirable that the average particle diameter of the metal particles "M" falls in the range of 1 to 4 μm and the average particle diameter of the other fine metal particles "m" falls in the range of 0.3 to 0.5 μm.

When the thickness of the ceramic green sheet 2 is 2 to 3 μm, it is desirable that the average particle diameter of the metal particles "M" falls in the range of 2 to 6 μm and the average particle diameter of the other fine metal particles "m" falls in the range of 0.4 to 0.6 μm.

When the thickness of the ceramic green sheet 2 is 3 to 4 μm, it is desirable that the average particle diameter of the metal particles "M" falls in the range of 3 to 8 μm and the average particle diameter of the other fine metal particles "m" falls in the range of 0.5 to 1.0 μm.

In this case, a gap between meshes of a plate making screen which forms the second internal electrodes 3b and 4b may be made larger than a gap between meshes of a plate making screen which forms the first internal electrodes 3a and 4a. This has been found to prevent clogging of the plate making screen in forming the second internal electrodes 3b and 4b.

The thickness of the formed second internal electrodes 3b and 4b formed becomes larger by making the gap between meshes of the net of screen plate making larger. However, since the number of laminated layers of the second internal electrodes 3b and 4b is less than the number of laminated layers of the first internal electrodes 3a and 4a, even when the thickness of the second internal electrodes 3b and 4b becomes large, the difference in level due to existence of the electrode patterns 3 and 4 is not problematic.

Figure 6:
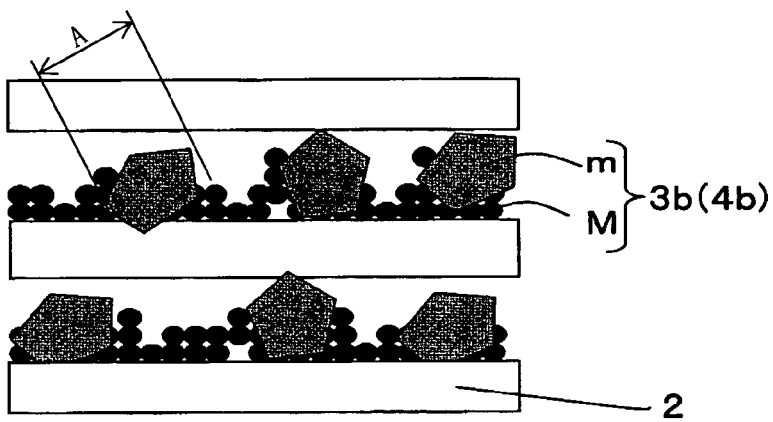

Next, as shown in FIG. 6, a predetermined number of ceramic green sheets 2 on which the second internal electrodes 3b and 4b are formed are laminated.

Figure 7:
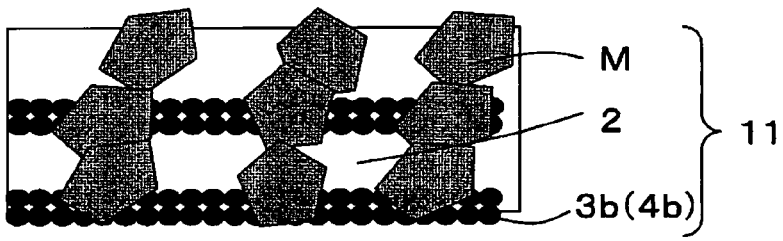

As shown in FIG. 7, a large-sized laminated body 11 is obtained by pressurizing the laminated ceramic green sheets 2. Since the metal particles "M" are contained in the second internal electrode 3b and 4b, the metal particles "M" break through the ceramic green sheets 2 and connect the vertically adjacent second internal electrodes to each other or become exposed on the surface of the large-sized laminated body 11. At this time, the vertically adjacent second internal electrodes may be connected to each other by one metal particle "M" or by two or more metal particles "M" linked in the laminate. It is expected that the vertically adjacent second internal electrodes are often connected to each other by one metal particle "M" when the particle diameter of the metal particle "M" is larger by two or more metal particles "M" linked in the laminating direction when the particle diameter of the metal particle "M" is smaller.

Preferably, the ceramic green sheet 2 broken through by the metal particles "M" is softer than the ceramic green sheet 2 arranged at the other parts. The softer green sheet can be made by being added by more plasticizer to the slurry.

The ceramic green sheet 2 on which the first internal electrodes 3a and 4a are formed and the ceramic green sheet 2 on which the second internal electrodes 3b and 4b are formed may be separately laminated and pressurized, and then joined.

In this case, by making the pressure exerted on the one ceramic green sheet 2, on which second internal electrodes 3b and 4b are formed, less than the pressure exerted on the other ceramic green sheet 2, on which the first internal electrodes 3a and 4a are formed, the metal particles "M" contained in the second internal electrode 3b and 4b break through the ceramic green sheet 2 certainly and the fine metal particle "m" contained in the second internal electrodes 3b and 4b do not break through the ceramic green sheet 2.

Subsequently, the large-sized laminated body 11 is cut to a predetermined size to obtain the unfired laminated body 1.

Figure 8:
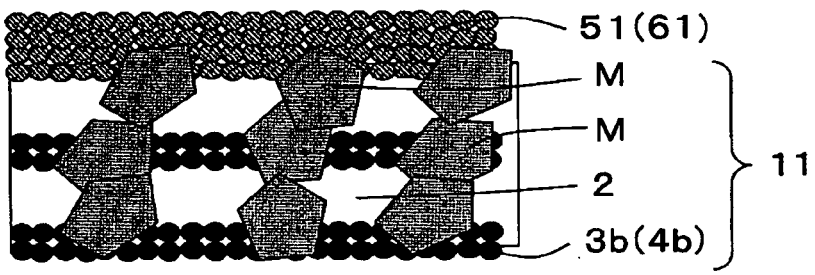

As shown in FIG. 8, the external electrode material 51 and 61 for electrodes 5 and 6 are formed on a pair of end faces and part way about four side faces of the laminated body 1. That is, the conductive paste obtained by adding or mixing suitable glass component, organic solvent, organic binder, etc. to the powder formed of a metal such as Ni, Cu, Cu—Ni or Ag is applied on a pair of end faces of the laminated body 1 by the conventionally-known dipping method, screen printing or the like. The metal particles "M" with relatively large particle diameter may be mixed in the conductive paste.

Then, the external electrodes 5 and 6 are fired at 700 to 900° C.

Figure 9:
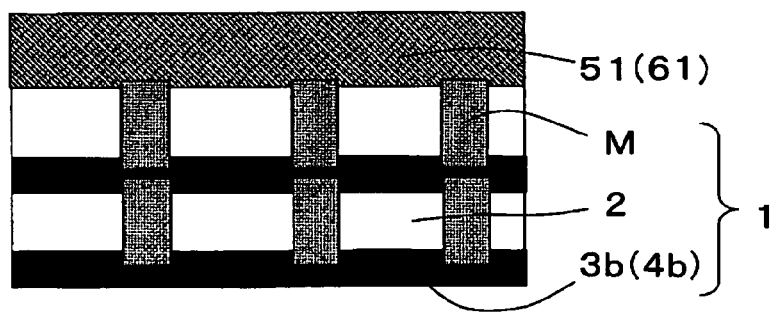

Finally, as shown in FIG. 9, by firing the laminated body 1 having the external electrodes 5 and 6 formed on its end faces at 1100 to 1400° C., for example, you obtain the laminated body 1 having the external electrodes 5 and 6 formed on the end faces and the extended portions 51 and 61 on the side faces is obtained.

A metal plating layer (not shown) such as Ni plating layer, Sn plating layer or solder plating layer is coated on surfaces of the external electrodes 5 and 6, when desired.

When the first internal electrodes 3 and 4 contain Ni as a main component and the external electrodes 5 and 6 also contain Ni as a main component, the external electrodes 5 and 6 are preferably coated with a Cu plating layer. That is, since Cu coating results in a fine metal plating layer, solder leaching can be prevented.

By this method, the ceramic capacitor 10 as shown in FIG. 2 can be obtained with improved mechanical strength that resist peeling.

The connections through the metal particles "M" with the metal components in the second internal electrodes 3b and 4b and the metal particles "M" with the metal components "m" in the external electrode 5 and 6 are made by sintering. Since the sintering process is originally contained in the manufacturing line, the existing manufacturing process need not be changed greatly and manufacturing is simplified.

Conventionally, in order to prevent peeling of the external electrodes 5 and 6, it was the practice to increase the amount of glass component contained in the conductive paste as a material for the external electrodes 5 and 6. This causes the problem that the electric interconnect resistance between the internal electrodes 3 and 4 and the external electrode 5 and 6 becomes high.

With the present invention, peeling of the external electrodes 5 and 6 can be prevented even when the lesser amount of glass component is contained in the conductive paste, and the electric interconnect resistance between the internal electrodes 3 and 4 and the external electrode 5 and 6 is kept low.

FIGS. 10 to 13 illustrate another method of manufacturing a ceramic component according to the present invention.

This manufacturing method is different from the earlier manufacturing method in that the external electrodes 5 and 6 are formed by a plating method.

Figure 10:
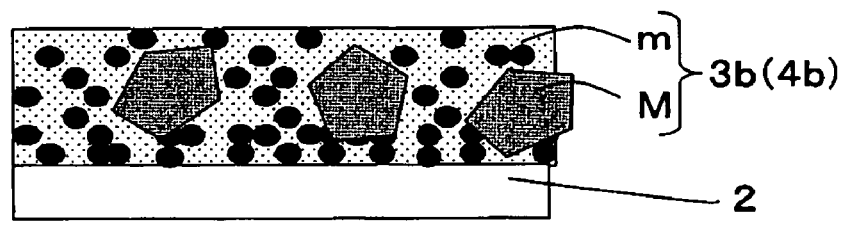
FIGS. 10 to 13 are sectional views that illustrate another method of manufacturing a ceramic capacitor according to the present invention.

As shown in FIG. 10, the conductive paste containing the metal particles "M" is applied to the surface of the ceramic green sheet 2 to form the second internal electrodes 3b and 4b.

Figure 11:
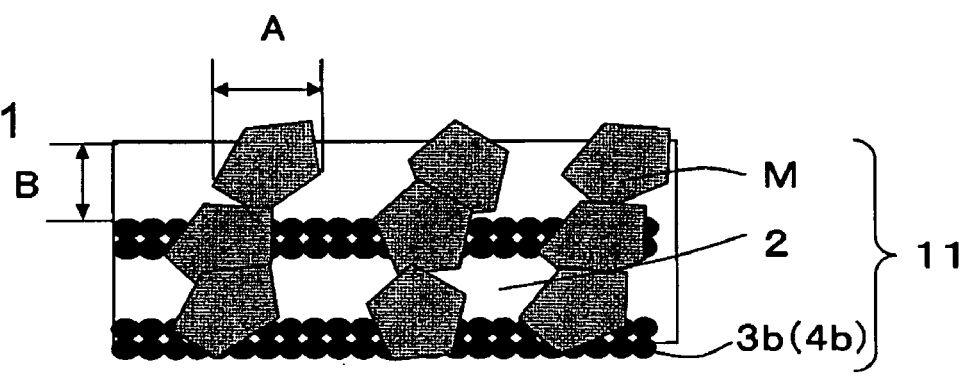

Next, as shown in FIG. 11, the ceramic green sheet 2 is laminated on the second internal electrode 3b and 4b and the metal particles "M" in the second internal electrode 3b and 4b are embedded into the ceramic green sheet 2 so as to be partly exposed on the surface of the ceramic green sheet 2.

Figure 12:
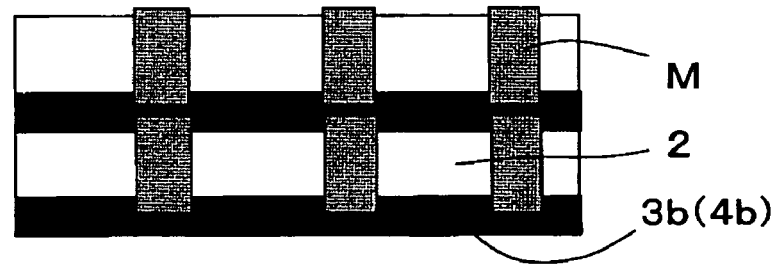

Next, as shown in FIG. 12, the ceramic green sheets 2 and the second internal electrodes 3b and 4b are fired. Then, metal particles "M" embedded in the laminated body 1 can be certainly exposed from the principal face of the laminated body 1 by polishing the fired laminated body 1 by plane polishing or barrel polishing.

Subsequently, the external electrodes 5 and 6 are bonded with the ends of the first internal electrodes 3a and 4a and the exposed portions of the metal particles "M" are formed on a pair of end faces and four side faces of the laminated body 1 formed by firing the ceramic green sheet 2 according to the electroless plating method.

Figure 13:
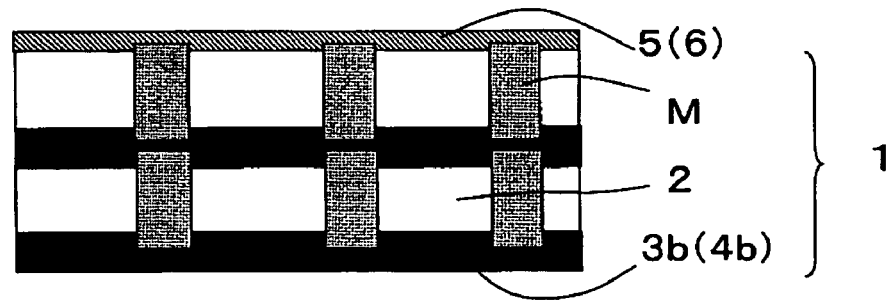

Specifically, as shown in FIG. 13, a metal plating film of Cu, Ni, Ag, Au or the like is deposited through deposition techniques by using the ends of the first internal electrodes 3a and 4a and the exposed portions of the metal particles "M" on the principal face of the laminated body 1 as the seed points. The external electrodes 5 and 6 each are integrally formed by bonding these deposits to each other.

In this manner, with the simple treatment of soaking the laminated body 1 in a plating liquid for electroless plating for a predetermined time period, the external electrodes 5 and 6 can be formed in a desirable pattern, thereby enabling improved accuracy of thickness of the external electrodes 5 and 6 and productivity of the ceramic capacitor 10.

Then, by applying a heat treatment (annealing) to the laminated body 1 on which the metal plating films 5 and 6 are deposited by the electroless plating method, an alloy layer may be formed on the boundary between the metal particles "M" and the metal plating films 5 and 6, respectively, thereby further increasing bond strength between the metal particles "M" and the metal plating films 5 and 6.

When the metal particles "M" are formed of Ni and the metal plating films 5 and 6 are formed of Cu, it is desirable to perform heat treatment at about 600° C.

Furthermore, if desired, a Ni plating film, Sn plating film or the like (not shown) may be formed on the surface of the metal plating film of Cu, Ni, Ag, Au or the like according to the electrolytic plating method. In this case, the heat treatment needs to be applied before forming the Ni plating film, Sn plating film or the like.

As described above, according to the present invention, second internal electrodes 3b and 4b are arranged within the laminated body 1 separately from the principal face of the laminated body across at least one dielectric layer 2, a plurality of metal particles "M" which are connected to the metal components in the second internal electrodes 3b and 4b by sintering and partly exposed on the side of the external electrode 5 and 6 are embedded in the dielectric layer 2 between the second internal electrodes 3b and 4b and the external electrodes 5 and 6, and the external electrode 5 and 6 are formed of the metal plating films deposited by using the exposed portions of the metal particles "M" as seed points.

Thus, since the external electrodes 5 and 6 are joined to the exposed portions of the metal particles "M" partly embedded in the laminated body 1 on the principal faces of the laminated body 1 by firm metal-metal bonding, bond strength between the external electrodes 5 and 6 and the principal faces of the laminated body 1 is increased.

The present invention is not limited to the embodiments described above.

Although the ceramic capacitor is used as a ceramic electronic component in the embodiments, the present invention can be applied to all ceramic electronic components such as laminated piezoelectric components, circuit boards and semiconductor parts.

Figure 14:
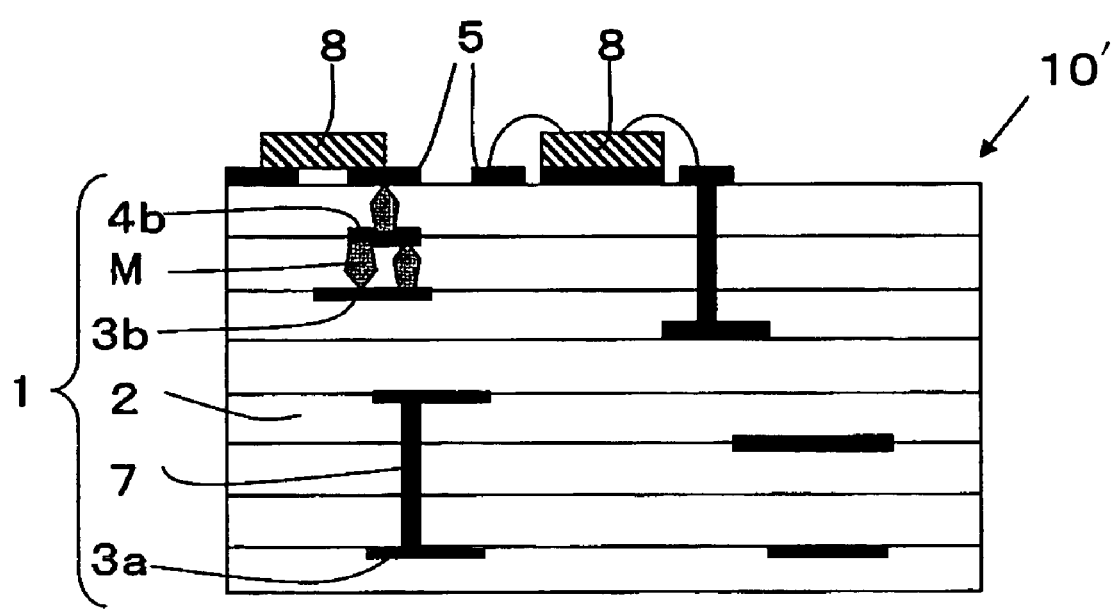
FIG. 14 is a sectional view, similar to FIG. 3, showing a ceramic electronic component in accordance with another embodiment of the present invention.

For example, as shown in FIG. 14, the present invention can be also applied to a circuit board 10'.

In FIG. 14, the circuit board 10' includes the laminated body 1 formed by laminating a plurality of ceramic dielectric layers 2 and the second internal electrodes 3b and 4b which intervene between the adjacent dielectric layers 2.

In the circuit board 10', the external electrode 5 is formed on the top surface of the laminated body 1'. As shown in FIG. 14, the external electrode 5 does not need to be on the end face of the laminated body 1'.

The external electrode 5 is connected to the second internal electrode 4b and the second internal electrode 3b is bonded to the second internal electrode 4b through the metal particle "M" existing in the ceramic layer 2 therebetween.

FIG. 14 shows an internal conductive pattern 3a via conductor 7 and other electronic components 8.

With this configuration, mechanical connection strength between the external electrode 5 and the principal face of the laminated body 1 can be increased, thereby effectively preventing peeling of the external electrode 5.

Further, the same ceramic particles as those in the ceramic dielectric layer 2 may be contained in the second internal electrode 3b and 4b. Thus, since the ceramic particles serve as bridging between the dielectric layers 2 which sandwich second internal electrodes 3b and 4b, peeling of the second internal electrode 3b and 4b from the dielectric layer 2 can be prevented.

What is claimed is:

1. A laminated electronic component having predetermined external electrodes, the component comprising:
   a body having a plurality of laminated layers and predetermined internal electrodes; and
   at least one internal electrode that is separated from the external electrode by at least one laminate layer and is bonded to the external electrode through a metal particle located in a separating layer.

2. The electronic component of claim 1, wherein the metal particle in the separating layer has an average particle diameter in a range of about 100 to 200% of the separating layer's thickness.

3. The electronic component of claim 1 wherein the external electrodes are comprised of metal plating films.

4. The electronic component of claim 3 wherein the metal particle in the separating layer has an average particle diameter in a range of about 100 to 200% of the separating layer's thickness.

5. The electronic component of claim 1 wherein the laminated layers are ceramic.

6. The electronic component of claim 5 wherein the metal particle in the separating layer has an average particle diameter in a range of about 100 to 200% of the separating layer's thickness.

7. The electronic component of claim 6 wherein the external electrodes are comprised of metal plating films.

8. A capacitor comprising:
    a laminated body having a plurality of dielectric layers that define end faces and principal faces;
    an internal electrode interposed between adjacent dielectric layers;
    an external electrode extended along one of said principal faces; and
    wherein the internal electrode is separated from the extended portion of the external electrode by a separating dielectric layer and is connected to the extended portion of the external electrode through a metal particle existing in the separating dielectric layer.

9. The capacitor of claim 8 further comprising a plurality of external electrodes.

10. The capacitor of claim 8 wherein the metal particle in the separating layer has an average particle diameter in a range of about 100 to 200% of the separating layer's thickness.

11. The capacitor of claim 8, wherein a plurality of the internal electrodes is disposed along a direction of lamination of the dielectric layers, and the plurality of the internal electrodes is connected by metal particles which exist in the dielectric layer between the internal electrodes.

12. The capacitor of claim 8 wherein the external electrode is comprised of a metal plating film.

13. The capacitor of claim 12 further comprising a plurality of external electrodes.

14. The capacitor of claim 13 wherein the metal particle in the separating layer has an average particle diameter in a range of about 100 to 200% of the separating layer's thickness.

15. An electrical component comprising:
    a laminated body having a plurality of dielectric layers that define end faces and principal faces;
    an internal electrode interposed between adjacent dielectric layers and extending to one of the end faces;
    an external electrode electrically connected to the internal electrodes at an end face, and extended along one of said principal faces; and
    a supplemental electrode that is spaced from the external electrode by at least one dielectric layer and is connected to the external electrode by a metal particle through the at least one dielectric layer.

* * * * *